(12) United States Patent
Heyd et al.

(10) Patent No.: US 10,416,731 B2
(45) Date of Patent: Sep. 17, 2019

(54) DATA STORAGE DRIVE MODULE CARRIER ASSEMBLY

(71) Applicant: Liqid Inc., Broomfield, CO (US)

(72) Inventors: Andrew Rudolph Heyd, Longmont, CO (US); Brenden Michael Rust, Loveland, CO (US); Seth Walsh, Superior, CO (US); Jason Breakstone, Broomfield, CO (US); Christopher R. Long, Colorado Springs, CO (US)

(73) Assignee: Liqid Inc., Broomfield, CO (US)

( * ) Notice: Subject to any disclaimer, the term of this patent is extended or adjusted under 35 U.S.C. 154(b) by 0 days.

(21) Appl. No.: 15/933,571

(22) Filed: Mar. 23, 2018

(65) Prior Publication Data

US 2018/0210519 A1   Jul. 26, 2018

Related U.S. Application Data

(63) Continuation of application No. 15/334,285, filed on Oct. 25, 2016, now Pat. No. 9,958,913, which is a continuation of application No. 14/732,448, filed on Jun. 5, 2015, now Pat. No. 9,501,110.

(60) Provisional application No. 62/008,289, filed on Jun. 5, 2014.

(51) Int. Cl.
*G06F 1/18* (2006.01)
*G11B 33/12* (2006.01)
*H05K 7/14* (2006.01)

(52) U.S. Cl.
CPC ............ *G06F 1/187* (2013.01); *G11B 33/128* (2013.01); *H05K 7/1487* (2013.01)

(58) Field of Classification Search
CPC ...... G06F 1/187; G11B 33/128; H05K 7/1487
See application file for complete search history.

(56) References Cited

U.S. PATENT DOCUMENTS

| 7,403,390 | B2 | 7/2008 | Franz et al. |
| 7,864,538 | B2 | 1/2011 | Wadsworth et al. |
| 7,983,032 | B2 | 7/2011 | Walker et al. |
| 9,245,587 | B2 | 1/2016 | Chen et al. |
| 9,326,415 | B2 | 4/2016 | Rauline |
| 9,501,110 | B2 * | 11/2016 | Heyd ...................... G06F 1/187 |
| 9,958,913 | B2 * | 5/2018 | Heyd ...................... G06F 1/187 |
| 2006/0061955 | A1 | 3/2006 | Imblum |
| 2007/0053169 | A1 | 3/2007 | Carlson et al. |
| 2007/0230109 | A1 | 10/2007 | Starr et al. |
| 2007/0247805 | A1 | 10/2007 | Fujie et al. |
| 2007/0279858 | A1 | 12/2007 | Grady et al. |
| 2009/0046419 | A1 | 2/2009 | Drake et al. |
| 2009/0161309 | A1 | 6/2009 | Yang |
| 2010/0214733 | A1 | 8/2010 | Suffern et al. |

(Continued)

*Primary Examiner* — Adrian S Wilson

(57) ABSTRACT

A data storage sled is provided. The data storage sled includes a circuit card assembly comprising connectors for coupling to drive modules and a host connector for coupling the data storage sled to an external connector, an enclosure comprising apertures in the enclosure through which individual ones of the drive modules can be inserted into an associated connector on the circuit card assembly. The data storage sled also includes drive module mounting assembles configured to hold the individual ones of the drive modules into the associated connector by at least including movable mounting features to accommodate varying lengths among the individual ones of the drive modules.

20 Claims, 13 Drawing Sheets

(56) References Cited

U.S. PATENT DOCUMENTS

2011/0102999 A1  5/2011 Liu et al.
2011/0267761 A1  11/2011 Peng et al.

* cited by examiner

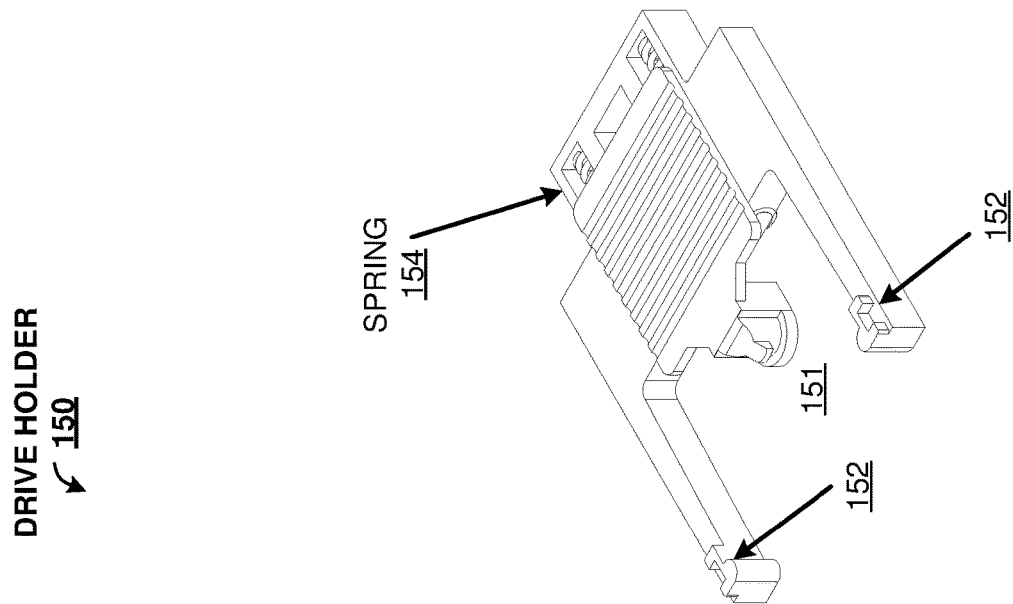
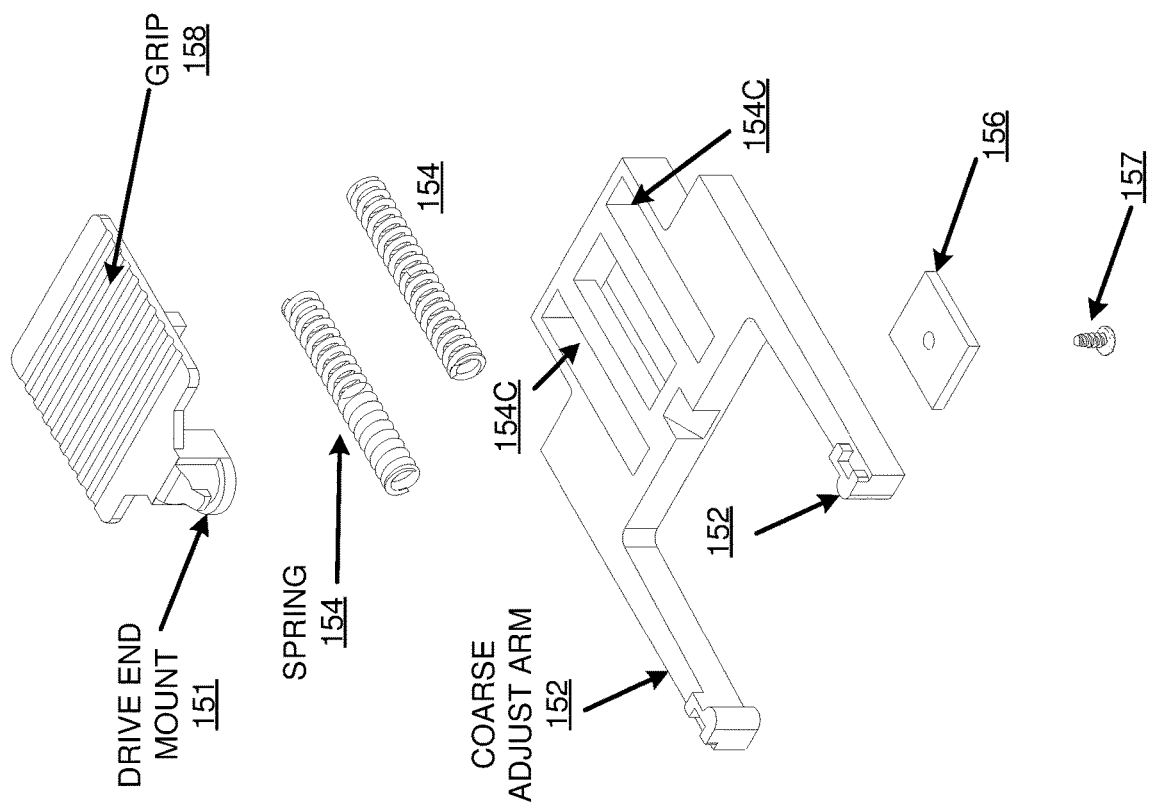
FIGURE 5

DATA STORAGE DRIVE MODULE CARRIER ASSEMBLY

RELATED APPLICATIONS

This application is a continuation of, and claims priority to, U.S. patent application Ser. No. 15/334,285, titled "DATA STORAGE DRIVE MODULE CARRIER ASSEMBLY," filed Oct. 25, 2016, which itself is a continuation of, and claims priority to, U.S. patent application Ser. No. 14/732,448, titled "ADJUSTABLE DATA STORAGE DRIVE MODULE CARRIER ASSEMBLY," filed Jun. 5, 2015. This application also hereby claims the benefit of and priority to U.S. Provisional Patent Application 62/008,289, titled "ADJUSTABLE SSD MEMORY MODULE MOUNTING IN STORAGE SLEDS," filed Jun. 5, 2014, which is hereby incorporated by reference in its entirety.

BACKGROUND

Computer systems typically include bulk storage systems, such as magnetic disk drives, optical storage devices, tape drives, or solid state storage drives, among other storage systems. As storage needs have increased in these computer systems, networked storage systems have been introduced which store large amounts of data in a storage environment physically separate from end user computer devices. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments.

However, as the densities of networked storage systems and remote computing systems increase, various physical limitations can be reached. These limitations include density limitations based on the underlying storage technology, such as in the example of large arrays of rotating magnetic media storage systems. These limitations can also include computing density limitations based on the various physical space requirements for network interconnect as well as the large space requirements for environmental climate control systems.

Bulk storage systems are traditionally limited in the number of devices that can be included per host and also have large physical space requirements due to the separate physical packaging of individual storage drives, which can be problematic in storage environments where higher capacity, redundancy, and reliability is desired. These shortcomings can be especially pronounced with the increasing data storage and retrieval needs in networked, cloud, and enterprise environments.

Overview

A data storage sled is provided. The data storage sled includes a circuit card assembly comprising connectors for coupling to drive modules and a host connector for coupling the data storage sled to an external connector, an enclosure comprising apertures in the enclosure through which individual ones of the drive modules can be inserted into an associated connector on the circuit card assembly. The data storage sled also includes drive module mounting assembles configured to hold the individual ones of the drive modules into the associated connector by at least including movable mounting features to accommodate varying lengths among the individual ones of the drive modules.

In another example, a data storage assembly comprising a number of removable data storage sleds is presented. The data storage assembly includes guide fins configured to partition the data storage assembly into a plurality of bays each configured to hold an associated data storage sled, and pins included in each of the plurality of bays to engage ejection springs of the data storage sleds.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

FIG. 5 is a diagram illustrating a drive module mount.

DETAILED DESCRIPTION

The examples herein discuss various data storage assemblies, such as data storage sleds. These data storage sleds are configured to carry many drive modules, such as solid state drive (SSD) cards, and couple these SSD cards to a host interface. In many examples herein, the SSD cards and host interface comprise PCIe interfaces. The data storage sleds can be inserted and removed in a data storage system which employs a PCIe fabric for switching PCIe traffic among a plurality of data storage sleds, processing modules, and network interfaces.

Figure 1:
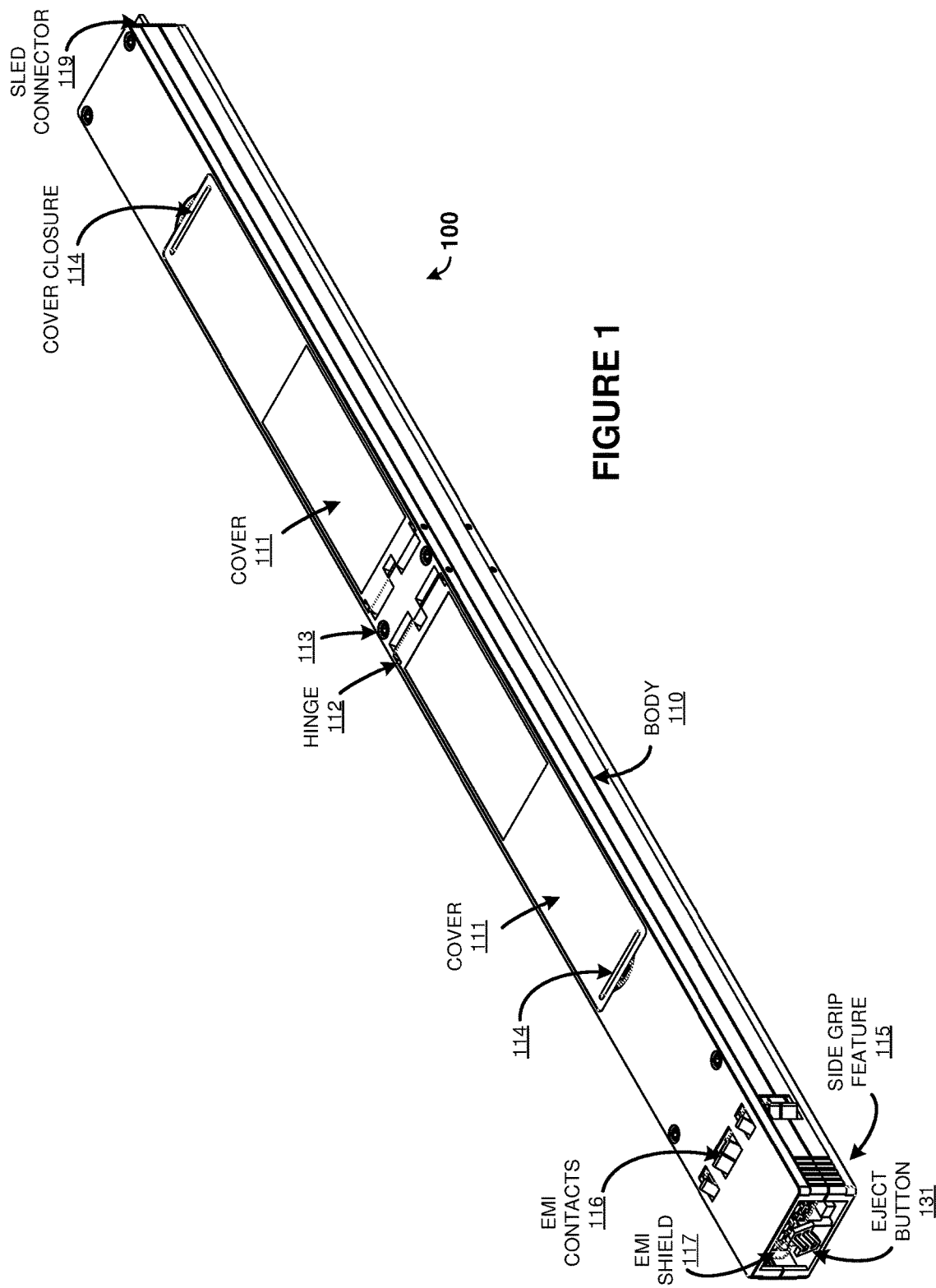
FIG. 1 is a diagram illustrating a storage sled.

As a first example of a data storage sled, FIG. 1 is presented. FIG. 1 is a diagram illustrating storage sled 100. Storage sled 100 includes various features and elements, and FIG. 1 illustrates at least storage sled body 110, drive module covers 111, cover hinges 112, body fasteners 113, cover closure features 114, side grip features 115, electromagnetic interference (EMI) contacts 116, EMI shield 117, sled host connector 119, and eject button 131. Although not shown in FIG. 1 for clarity and due to the selected view, storage sled 100 also includes other features and elements as detailed in subsequent figures and discussion below. The mechanical and structural elements of storage sled 100 and associated mechanical and structural elements in FIGS. 1-11 can comprise machined, forged, cast, extruded, or other manufactured elements. These elements can be made of metals, metallic compounds, polymers, plastics, ceramics, or other materials, including combinations and variations thereof.

Figure 4:
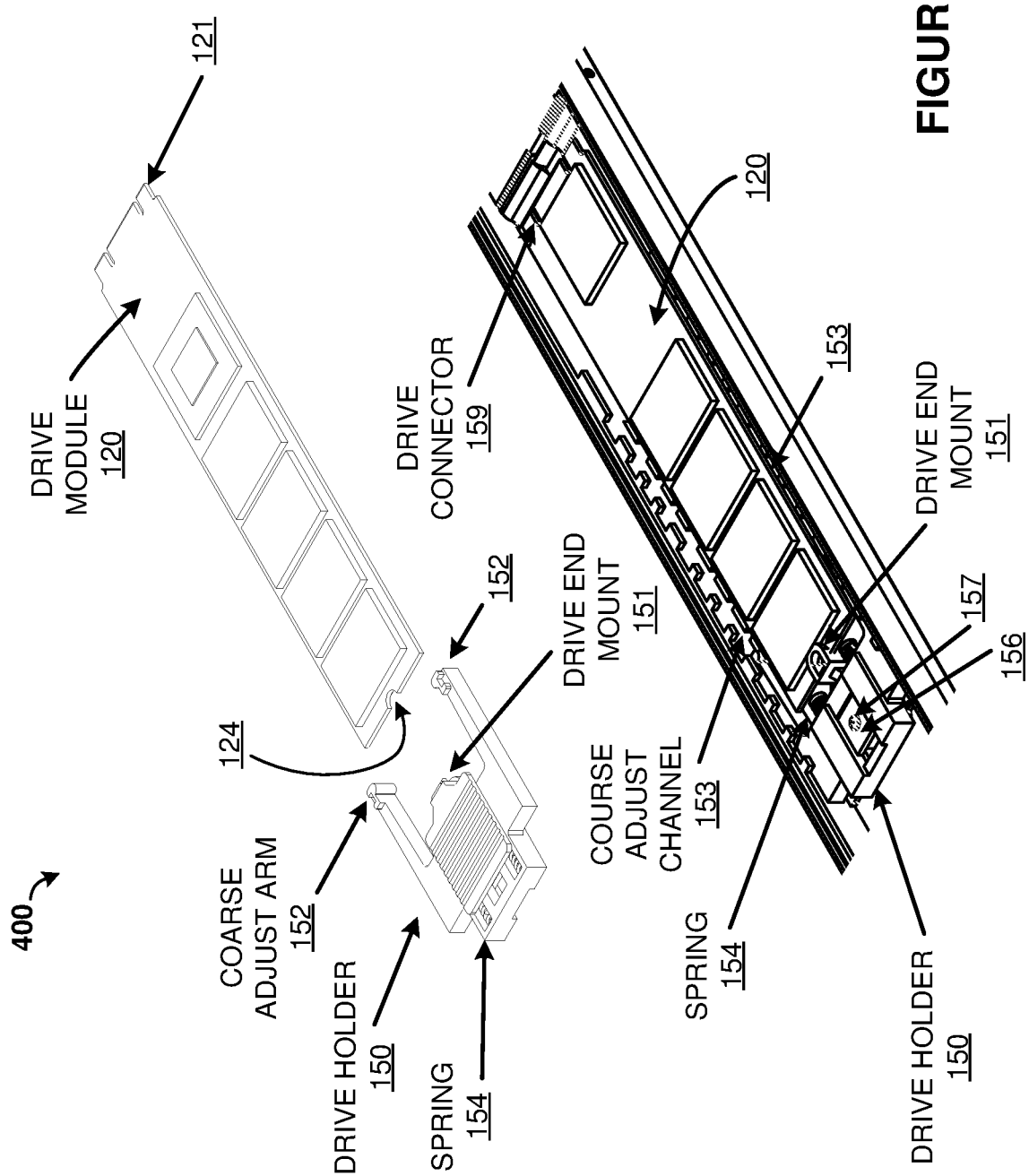
FIG. 4 is a diagram illustrating a drive module mounting mechanism.

Storage sled 100 is configured to carry one or more drive modules, such as assembly drive module 120 in FIG. 4, among other drive modules. In this example, up to four drive modules can be held by storage sled 100, with one carrier assembly covered by an associated cover 111 after being inserted into storage sled 100. Each of covers 111 can be opened by a user or operator using associated ones of cover closure features 114. Each of covers 111 can be hinged at hinge 112 which allow a user to rotate the associated cover outward from sled 100 to gain access to an aperture in which a drive module is inserted and removed. In some examples, hinge 112 is spring-loaded and upon pressing a latch or friction-fit feature of closure 114, hinge 112 allows cover 111 to open outward. When spring-loaded, hinge 112 can provide resistance to closure by a user and a latch or mating features of cover closure 114 to keep cover 111 closed and flush with body 110.

Figure 7:
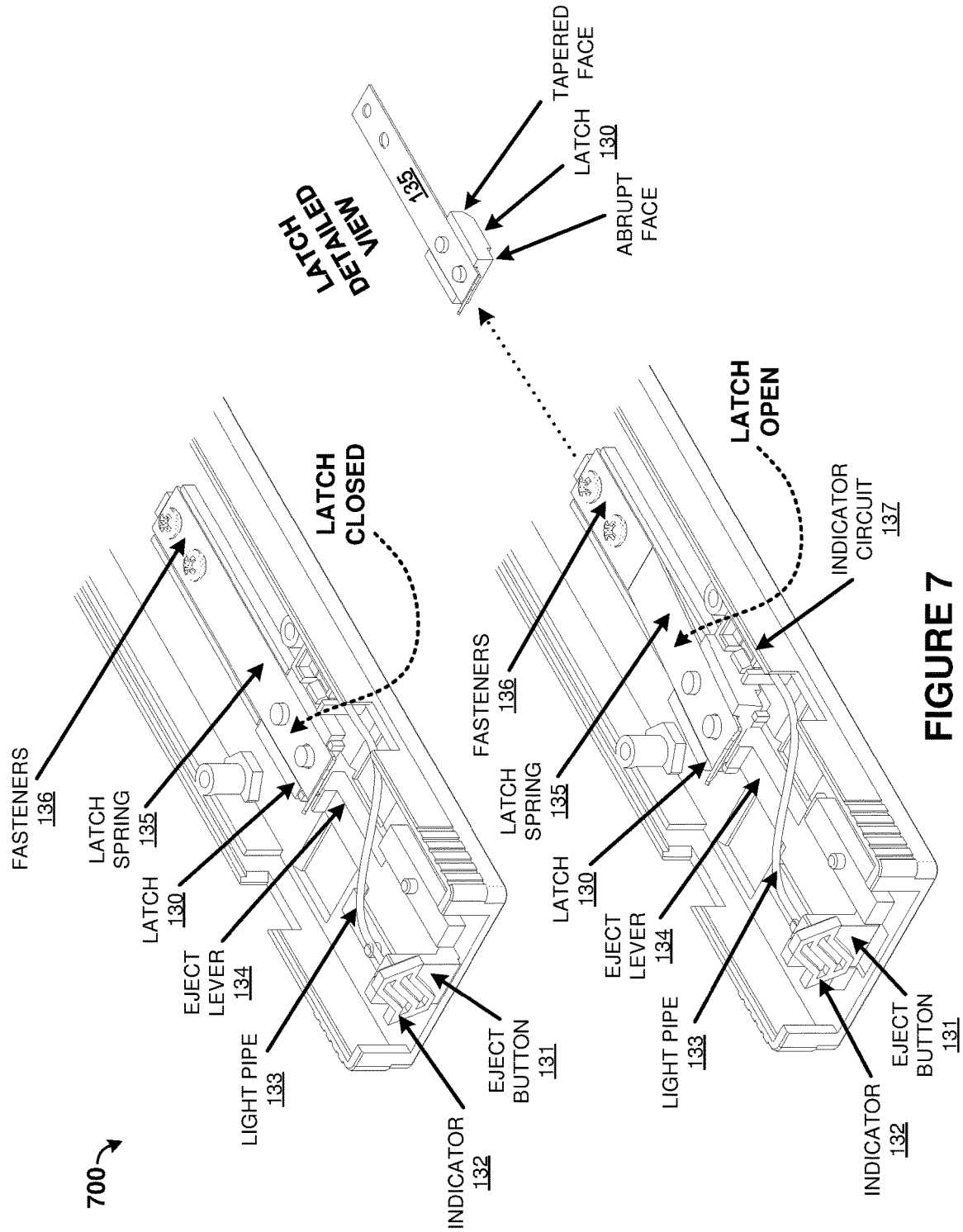
FIG. 7 is a diagram illustrating a storage sled latching mechanism.
Figure 8:
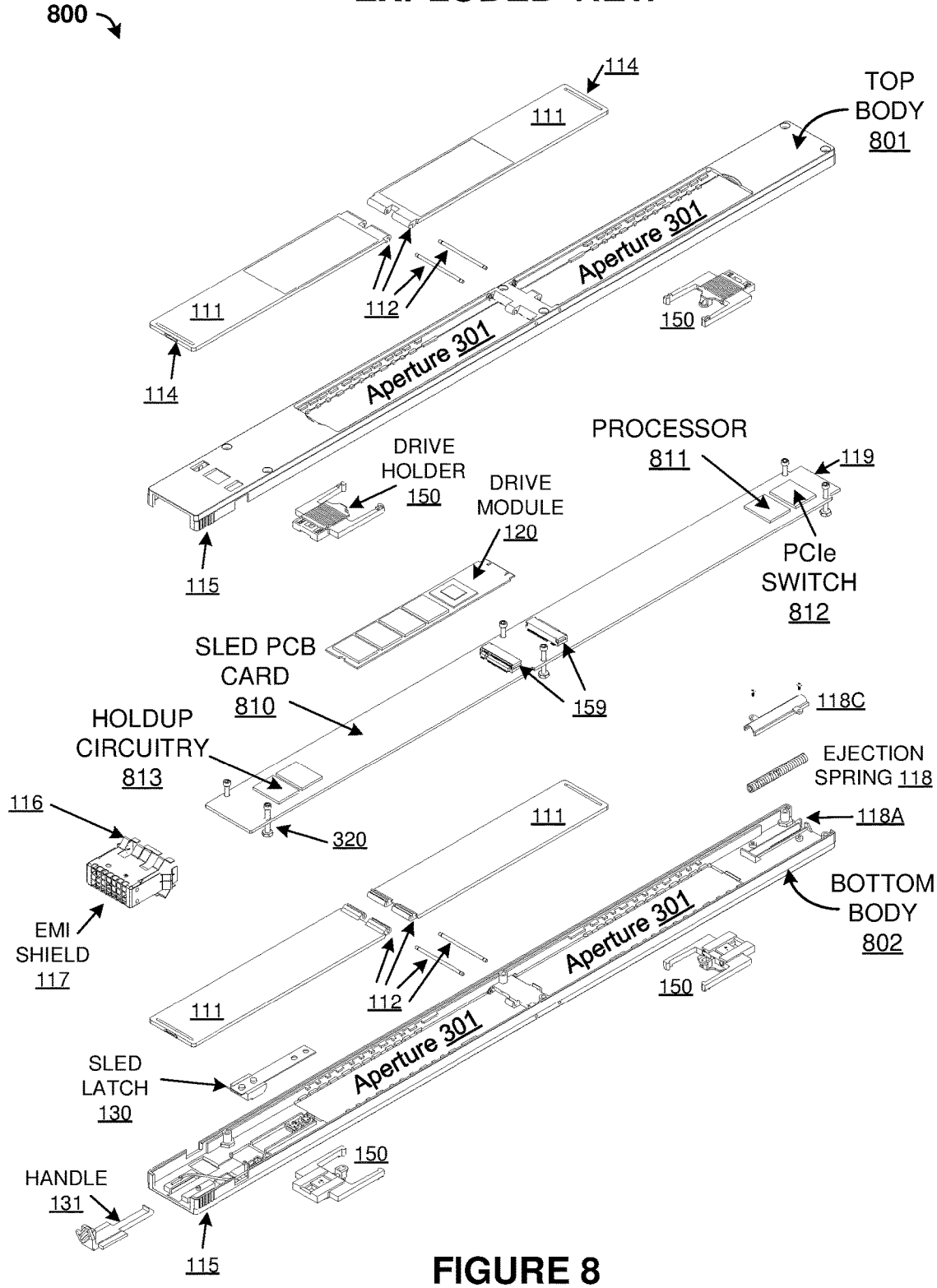
FIG. 8 is a diagram illustrating a storage sled.

Storage sled body 110 is composed of at least two shell portions, namely a top body and a bottom body (such as elements 801-802 in FIG. 8). The at least two body portions enclose a printed circuit board, sled insertion elements, and drive module mounting elements, and are secured together with fasteners 113, such as screws, rivets, clips, welds, and the like. Storage sled body 110 is configured to be slid into associated mating features of a larger enclosure or storage assembly which can hold many storage sleds, as featured in FIGS. 10-11 below. Latch features, such as pictured in FIG. 7, are included on the bottom of sled 100 and are configured to engage with associated latch mates within the larger storage assembly to provide purchase of storage sled 100 within the associated mounting rails or features as well as provide resistance to removal of storage sled 100 from the associated mounting features in the storage unit. Eject button 131 is coupled to the latch features to allow for ejection and removal of storage sled 100 from the storage assembly. Side grip features 115 allow for a human operator to grip storage sled 100 for insertion and removal from an associated storage assembly. Once slid into associated mounting rails, guides, or features of the larger storage assembly, sled host connector 119 is configured to electrically and mechanically mate with an associated external connector, such as a connector on a midplane or backplane PCB of the larger storage assembly.

Additionally, FIG. 1 shows EMI contacts 116 and EMI shield 117. EMI contacts 116 and EMI shield 117 are configured to electrically mate with at storage sled body 110 to form a Faraday cage with the top body and bottom body. EMI shield 117 is shown with holes or perforations of a predetermined size. This predetermined size can be driven by emission characteristics of the electrical components of storage sled 100 or by electrical interference provided by an environment that storage sled 100 is positioned within. EMI contacts 116 and EMI shield 117 can each be composed of metallic or conductive materials. When storage sled body 110 is composed of non-conductive materials, then a metallic layer, such as a coating or foil, can line inner or outer surfaces of storage sled body 110 to provide shielding, which electrically contacts EMI contacts 116 and EMI shield 117. In some examples, EMI contacts 116 and EMI shield 117 are formed from the same piece of conductive material, such as a stamped metal part that is folded and welded or soldered together to form EMI contacts 116 and EMI shield 117. In other examples, EMI contacts 116 and EMI shield 117 are formed from a machined metallic part or formed from separate pieces and electrically bonded together. EMI contacts 116 comprise one or more metallic fingers or springs which electrically contact both body 110 and an associated storage assembly into which storage sled 100 is inserted or into a rack-mounted assembly into which the storage assembly is inserted. Thus, body 110 and EMI shield 117 form a Faraday cage around electrical components of storage sled 100 and EMI contacts 116 are configured to touch external conductive surfaces and hold contact with the surfaces using a spring force formed by EMI contacts 116 extending outward from sled 100.

Figure 2:
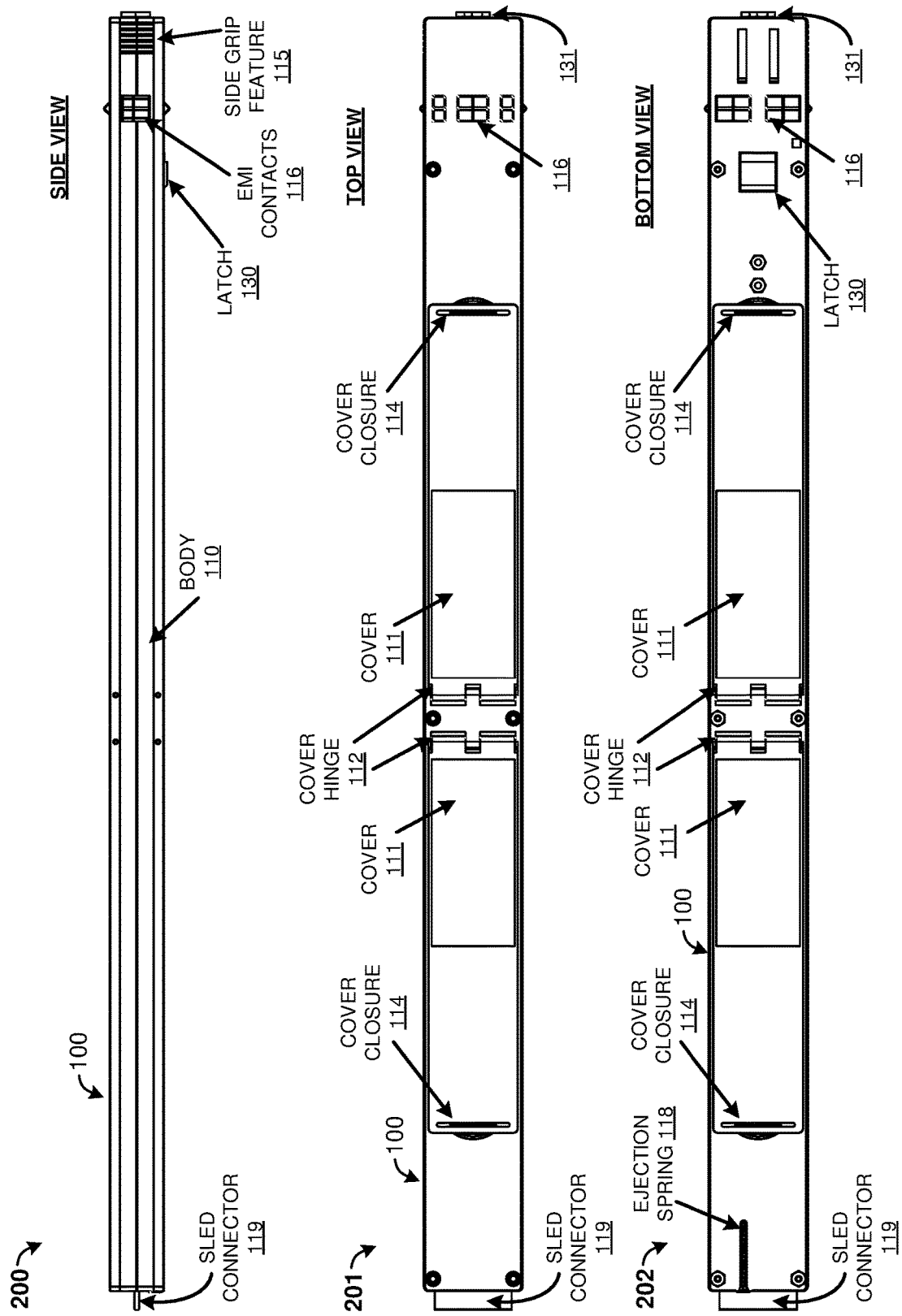
FIG. 2 is a diagram illustrating various views of a storage sled.

FIG. 2 is a diagram illustrating various views of storage sled 100. Side view 200 shows storage sled 100 from one of the sides, and highlights some of the elements discussed in FIG. 1. Top view 201 shows storage sled 100 from the top, and also highlights some of the elements discussed in FIG. 1. Bottom view 202 shows storage sled 100 from the bottom, and also highlights some of the elements discussed in FIG. 1.

Additionally, the bottom view 202 illustrates additional features latch 130 and insertion spring 118. Latch 130 is coupled to internal mechanism and eject button 131. Latch 130 fits into an accompanying slot when storage sled 100 is inserted into a storage assembly, such as shown by sled latch holes 1020 of FIG. 10. Ejection spring 118 is included an associated channel in storage sled 100. When storage sled 100 is removed from a storage assembly, then spring 118 is expanded or uncompressed. When storage sled 100 is inserted into a storage assembly, a mating feature, such as a compression pin or protrusion, in the storage assembly contacts spring 118 and compresses spring 118 upon insertion of storage sled 100. When eject button 131 is pressed and latch 130 is raised to allow storage sled 100 to be removed from the storage assembly, tension in compressed spring 118 aids removal of storage sled 100 from the storage assembly by pushing storage sled 100 outward from an associated bay in the storage assembly. Insertion of storage sled 100 in an incorrect orientation is prevented by the mating feature, such as the pin or protrusion, in the storage assembly.

A channel is included in the enclosure of storage sled 100 to allow for the mating feature or pin to engage spring 118, but this channel is not found on the opposite side of sled 100, and insertion upside-down (or backwards) in the storage assembly is prevented past a predetermined point. This prevents damage to connector 119 or to electrical and mechanical components to storage sled 100 by improper insertion. A further discussion of the latch and spring mechanisms are found in FIGS. 7-9.

Figure 3:
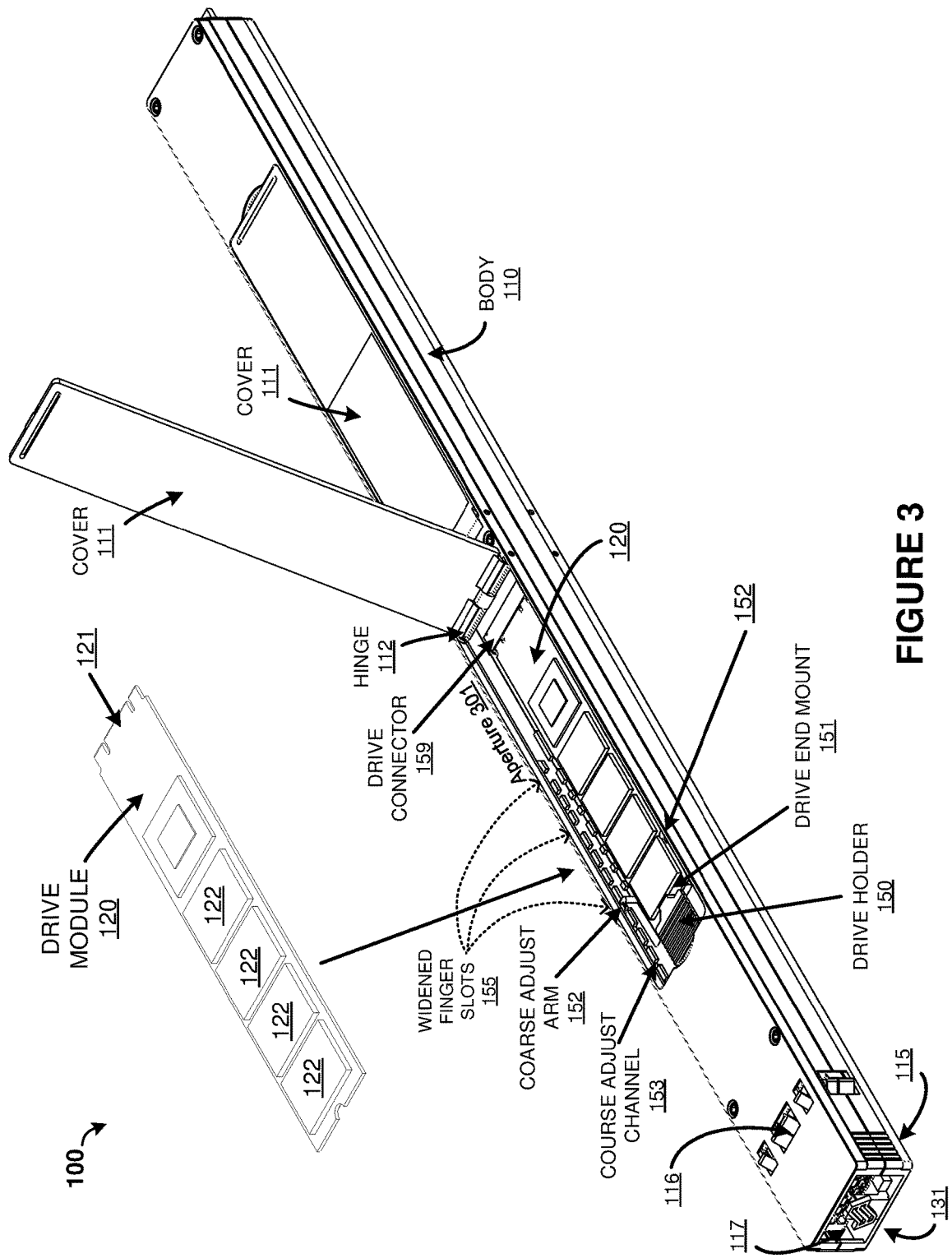
FIG. 3 is a diagram illustrating drive module insertion into a storage sled.

FIG. 3 is a diagram illustrating drive module 120 insertion into storage sled 100. In FIG. 3, cover 111 is opened by pivoting around hinge 112. In some examples, hinge 112 is coupled to a spring which holds cover 111 open when a user opens cover 111. Cover 111 reveals aperture 301 into which module 120 is inserted. Module 120 has at least one edge connector 121 which is inserted into connector 159 in storage sled 100. Module 120 is then pressed downward into aperture 301 and end mount 151 of module holder 150 secures to an end of module 120 opposite of connector 121. End mount 151 is tensioned by a spring and allows for various lengths of drive modules. A finger of an operator can pull end mount 151 to compress the associated spring and allow for insertion of drive module 120. Coarse adjust arm 152 also allows for various lengths of drive modules, but for larger adjustments than end mount 151. Sled 100 can accommodate up to four drive modules 120, although a different number can be employed. Further discussion of mounting of drive module 120 is discussed in FIGS. 4-5.

Drive module 120 includes solid state memory chips 122, and edge connector 121. In some examples, the solid state storage elements of drive module 120 include memory chips, such as chips 122 which can comprise flash memory, magnetic random access memory, phase change memory, memristors, or other solid state memory devices. Drive module 120 can comprise different form factors of drive modules. Drive module 120 can include other components and elements, such as mounting holes, processors, interface chips, passive components, holdup circuitry, among other components and elements. In some examples, drive module 120 comprises a M.2 solid state drive (SSD) module, which can have a variable dimensions, such as width and length, based on model, manufacturer, storage capacity, or embedded features, among other factors. Other examples include MiniPCI express cards, mini-serial ATA (mSATA) cards, and the like, with varying dimensions. For example, end mount 151 and coarse adjust features 152 and 153 allow for varying lengths of M.2 SSD modules, such as lengths of 16, 26, 30, 38, 42, 60, 80 and 110 millimeters (mm), among others. Advantageously, commodity or off-the-shelf M.2 SSD modules (or other drive modules) can be deployed in storage sled 100 using the adjustable mounting features.

Removal of drive module 120 from storage sled 100 is as follows. Cover 111, flush with body 110 when closed, is opened using a fingernail or small item that engages cover closure 114. Cover 111 is opened by a user, or by a spring associated with hinge 112 to expose drive module 120 in aperture 301. A finger or small object can engage a grip on drive holder 150 to slide drive end mount 151 away from drive module 120. Drive end mount 151 is spring or resistance loaded and provides force to hold drive module 120 into drive connector 159. Drive module 120 can then be removed from associated connector 159 and from sled 100. Advantageously, sled 100 allows for tool-less insertion and removal of many drive modules.

Thus, the drive module mounting assembly comprising at least drive holder 150, slide drive end mount 151, and arms 152 allow for coarse adjustment features and fine adjustment features. The coarse adjustment features are configured to select among standardized lengths of the drive modules and the fine adjustment features configured to hold an associated drive module in an associated connector and compensate for variability in the standardized lengths of the drive modules. As discussed herein, the coarse adjustment features comprise arms 152 on the drive module mounting assembles which locate into side channels 153 of the enclosure or body 110 of sled 100 to select among the standardized lengths of the drive modules. To provide specific examples of these coarse and fine adjustable mounts, FIGS. 4 and 5 are presented.

FIG. 4 is a diagram illustrating a drive module mounting mechanism 400. In FIG. 4, drive module 120 can be mounted and held securely in storage sled 100. Specifically, connector 159 is mounted onto an associated circuit board of storage sled 100 and connector 121 of drive module 120 is then inserted into connector 159 and held in place by adjustable mounting features of sled 100.

FIG. 4 shows drive holder 150 with drive end mount 151, coarse adjustment arms 152, and one or more springs 154. Drive end mount 151 is configured to mate with an end or edge of drive module 120. In some examples, drive module 120 includes a screw cutout 124 for mounting in systems which employ screwed mounting schemes. However, in sled 100, a tool-less design is employed which does not require a screw to secure drive module 120 in sled 100. Drive end mount 151 can engage this screw cutout for additional purchase onto drive module 120, although this configuration is not required. Drive holder 150 is fitted into coarse adjust channels 153 on either side of sled 100, and coarse adjust arms 152 can slide along the length of sled 100 within channels 153.

Coarse adjust arm 152 also allows for various lengths of drive modules, typically for larger adjustments than end mount 151. Fingers formed into channels 153 can set discrete coarse length selection points for arms 152. For example, FIG. 4 shows three coarse adjustment lengths indicated by the wider fingers formed into channels 153. These coarse adjust features in channels 153 allow for varying discrete lengths of M.2 SSD modules, such as at least three discrete lengths comprising 110 mm, 80 mm, and 60 mm lengths, among others. More than three predetermined locations can be employed, such as when each finger sets a discrete length. When drive module 120 is not inserted, arms 152 can slide in channel 153 to adjust drive holder 150 into a desired discrete coarse length adjustments.

In some examples, arms 152 can locate into the pictured finger slots in channels 153 at predetermined locations to allow for the discrete length adjustments. Arms 152 can locate into the finger slots from above or below. In some examples, a predetermined number of widened finger slots 155 can be employed which set the coarse adjustment levels by matching widened slots 155 to a width of rectangular features on the ends of arms 152. FIG. 3 shows widened finger slots 155, which are widened relative to the other finger slots. The non-widened finger slots are not required with a predetermined number of widened slots is employed. However, manufacturability of the body pieces can be aided in having the finger slots in some examples.

In further examples, screw 157 is configured to mate with one or more predetermined holes in body 110 to further secure drive holder 150 into any of the predetermined coarse adjustment lengths. In another example, screw 157 can engage into a channel in body 110 to allow for any number of coarse adjustment lengths along the channel. Arms 152 may be made flexible to enable a snapping feature of arms 152 to locate arms 152 into the finger slots, at least by providing by a spring force due to flexible action of arms 152 with fulcrum points where arms 152 attach to drive holder 150.

End mount 151 is tensioned by a spring and allows for various fine length adjustments of drive modules. For example, although a drive module might be designed for a particular length, such as 110 mm, 80 mm, and 60 mm lengths, variation in actual drive modules installed into sled 100 might vary due to manufacturing tolerances, inaccuracies of reported specifications, or other variations. Coarse adjust arms 152 can be positioned for a particular length, but drive holder can provide purchase and tension onto drive module 120 to hold drive module into connector 159. During insertion, a finger of an operator can pull end mount 151 to compress the associated spring and allow for insertion of drive module 120. End mount 151 engages an end or edge of drive module 120 and when released by the operator spring 154 expands and places pressure onto drive module 120 to hold securely into connector 159 and in sled 110.

FIG. 5 provides a further detailed exploded view of the drive mount elements. Drive end mount 151 can be seen as a separate element which can slide with respect to a piece which houses springs 154 in spring channels 154C and forms coarse adjust arms 152. Further elements can be employed to hold drive holder 150 in a coarse position within channels 153 or sled 120. Specifically, mounting screw 157 and mounting plate 156 can be employed to fasten drive holder 150 relative to a top or bottom body of sled 110. Variations on these elements are possible, such as a different number or configuration of spring elements or fastener elements.

Figure 6:
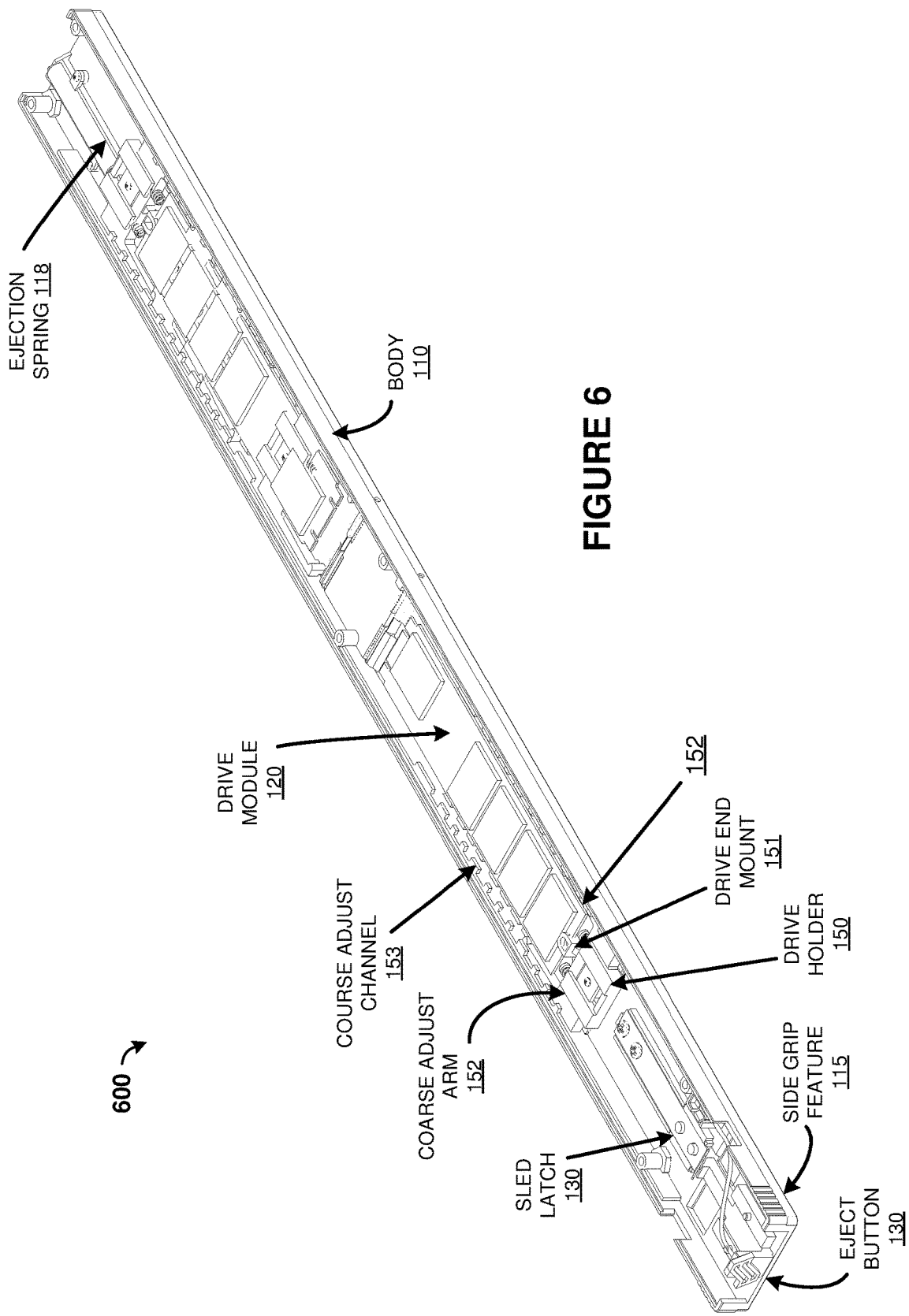
FIG. 6 is a diagram illustrating various views of a storage sled.

FIGS. 6 and 7 provide a further view of storage sled 100, namely sectioned internal views. FIG. 6 illustrates at least two drive modules 120 mounted into storage sled 100. FIGS. 6 and 7 also provide a view of various sled insertion and ejection features. Sled latch 130 is attached to flexible spring member 136 which is fastened at one end to body 110 using one or more fasteners and free to flex at the other end, forming a spring lever action that can lift and lower latch 130 through an associated latch aperture in body 110.

To insert storage sled 100 into a storage assembly, an operation can slide storage sled 100 into an associated slot of the storage assembly. Spring force provided by latch spring 135 keeps latch 130 in a normally lowered or extended position. However, a tapered or wedge shape on an entry surface of latch 130 (facing the direction of connector 119) allows for insertion sliding action to compress spring 135 and raise latch 130 into body 110 of sled 100 when latch 130 contacts a surface of the storage assembly. When a proper depth of insertion is reached for sled 100, a hole or aperture in the surface of the storage assembly allows for latch 130 to drop down and engage the aperture due to the spring force provided by latch spring 135. The hole or apertures can be seen in FIG. 10, such as holes 1020. Once inserted, removal or inadvertent ejection of sled 100 is prevented by latch 130 protruding into the hole or aperture of the surface of the storage assembly. Latch 130 can have a generally square or abrupt shape on an exit surface of latch 130 (facing the direction of eject button 131) to resist ejection. Furthermore, ejection spring 118 is compressed upon insertion by a tab, pin, or other feature on the surface of the storage assembly on which sled 100 slides during insertion.

To eject storage sled 100 from a storage assembly, eject button 131 is able to be pushed by an operator, and consequently move eject lever 134 which can engage latch spring 135. Latch spring 135 is raised by a wedge feature on eject lever 134 and thus moved by pushing eject button 131. Movement of eject lever 134 and eject button 131 is opposed by a spring force provided by latch spring 135 and fasteners 136. Flexing latch spring 135 upward also raises attached latch 130, which then disengages with a mating aperture in a storage assembly into which storage sled 100 is inserted. The ejection process allows storage sled 100 to slide within a storage assembly into which sled 100 was previously inserted. Ejection spring 118, previously compressed by an insertion process, provides ejection force for sled 100 to move outward from a mating connector of the storage assembly and the storage assembly itself.

In further examples, a lighted ejection or insertion indicator 132 can be coupled to eject button 131. This indicator may be customized to appear as a logo or other shape or size. Various transparent or translucent features can allow light to be emitted from indicator 132, such as glass, acrylic, or other polymer. In some examples, a light, such as a light emitting diode, can be included in indicator 132 which can indicate various properties of sled 100. These properties can include insertion or ejection status, such as lit when properly inserted and unlit when ejected. These properties can include other functional properties, such as an operational status of elements of sled 100. In the examples seen in FIG. 7, light pipe 133 is employed to carry light from indicator circuit 137 to indicator 132. Light pipe 133 can comprise a fiber optic element or polymer light guide, among other elements. In examples where a light is mounted into indicator 132, light pipe 133 can instead comprise one or more wires or signal links. Indicator circuit 137 can be communicatively coupled to processing elements of sled 100, such as processor 811.

FIG. 8 illustrates an exploded view of storage sled 100. Similar elements as discussed above are shown in FIG. 8, although variations are possible. Additionally, various electrical components are shown in FIG. 8. Specifically, FIG. 8 includes a sled printed circuit board, indicated by circuit card assembly (CCA) 810, which can mount up to four drive modules through associated apertures 301 into connectors 159, two each on the top and bottom of CCA 810. A CCA includes a printed circuit board along with attached electrical and mechanical components. CCA 810 can be an example of CCA 1250 in FIG. 12, although variations are possible. CCA 810 includes drive module connectors 159, sled connector 119, processor 810, Peripheral Component Interconnect Express (PCIe) switch 812, and holdup circuitry 813. Although one CCA 810 is shown in FIG. 8 which has four drive module connectors soldered thereto, other examples can employ individual CCAs for each drive module connector, or variations thereof. Further description of these elements is include in FIG. 12.

Figure 9:
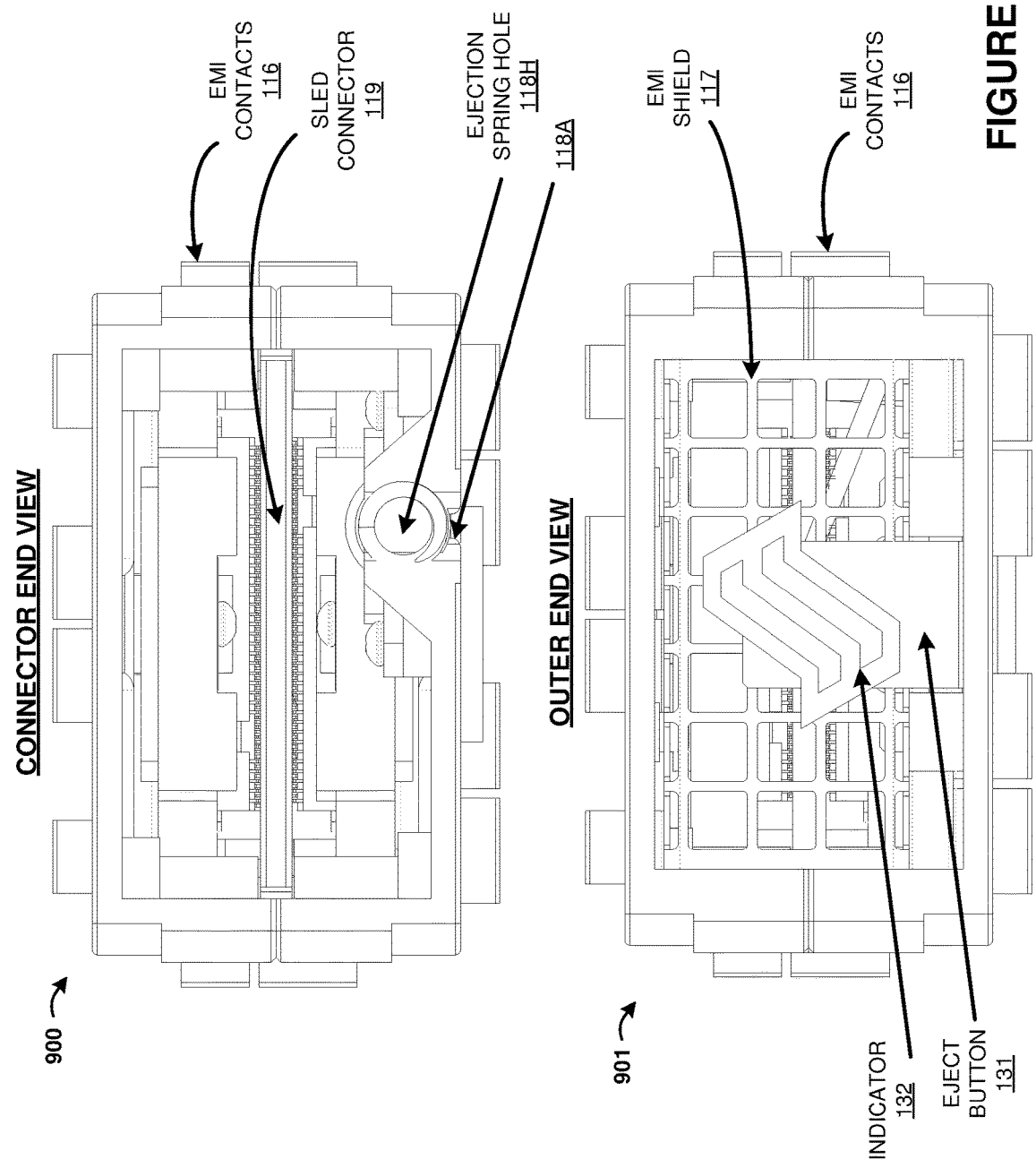
FIG. 9 is a diagram illustrating a storage sled.
Figure 12:
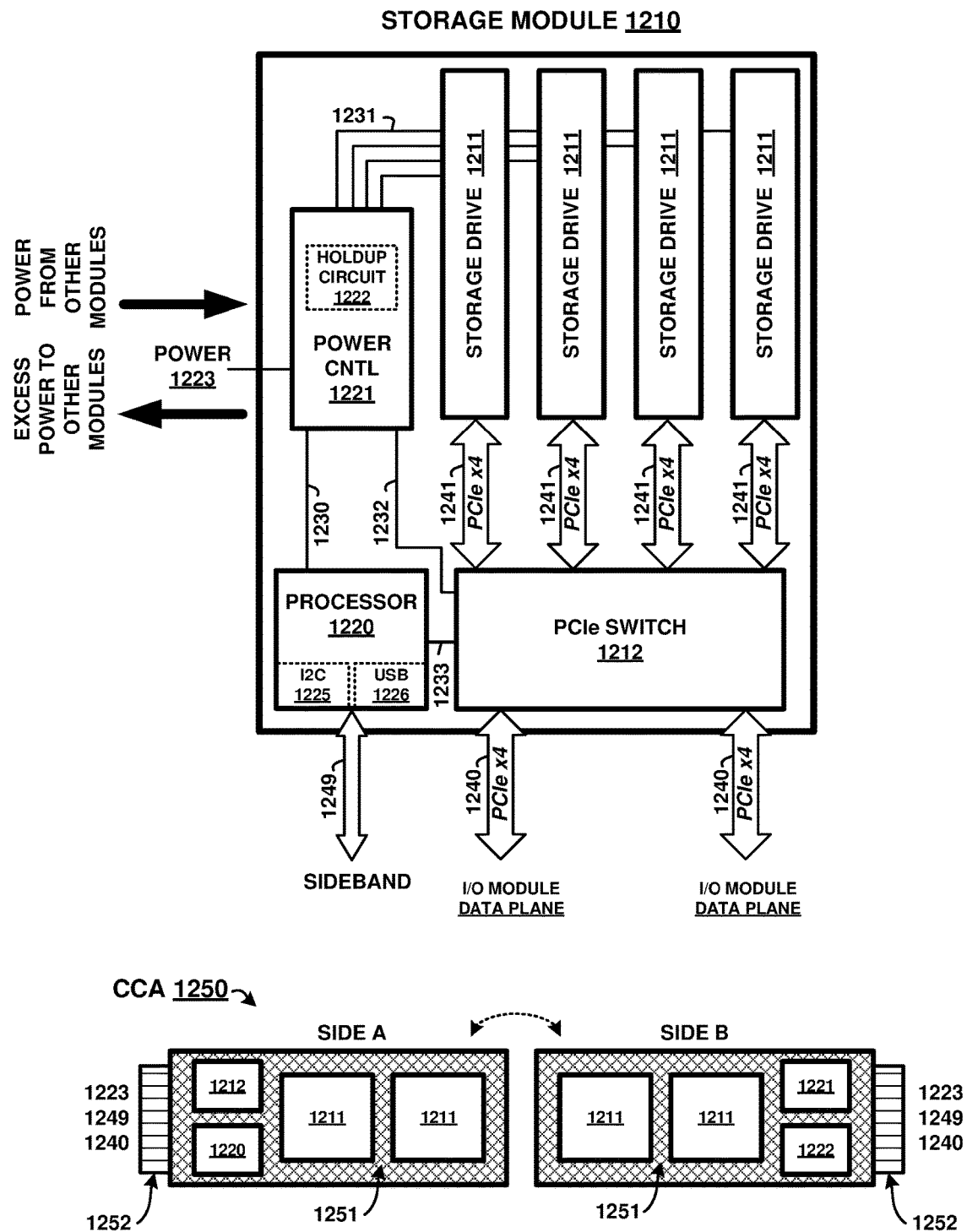
FIG. 12 is a block diagram of a storage sled.

FIG. 9 illustrates end views of storage sled 100. Connector end view 900 shows EMI contacts 116, sled connector 119, ejection spring hole 118H, and ejection spring channel 118A, among other features. Sled connector 119 inserts into a mating connector of a backplane, midplane, or other CCA associated with a storage assembly, such as shown in FIG. 12. Ejection spring hole 118H allow for a cavity into which ejection spring 118 can be held, and compressed/expanded. Channel 118A allows for a pin or other raised feature on an associated storage assembly to engage spring 118 and to compress spring 118 during insertion. Channel 118A also allows for only one orientation of insertion of sled 100 into a storage assembly, as the pin or other raised feature on the storage assembly would impact features of body 110 and prevent further insertion of sled 100 due to interference with the pin or other raised feature.

Outer end view 901 shows EMI contacts 116, EMI shield 117, indicator 132, and eject button 131, among other features. EMI shield 117 forms an air-porous electrical shield for components of sled 100 to provide for cooling airflow while attenuating or blocking predetermined frequency ranges of radiative electromagnetic energy.

Figure 10:
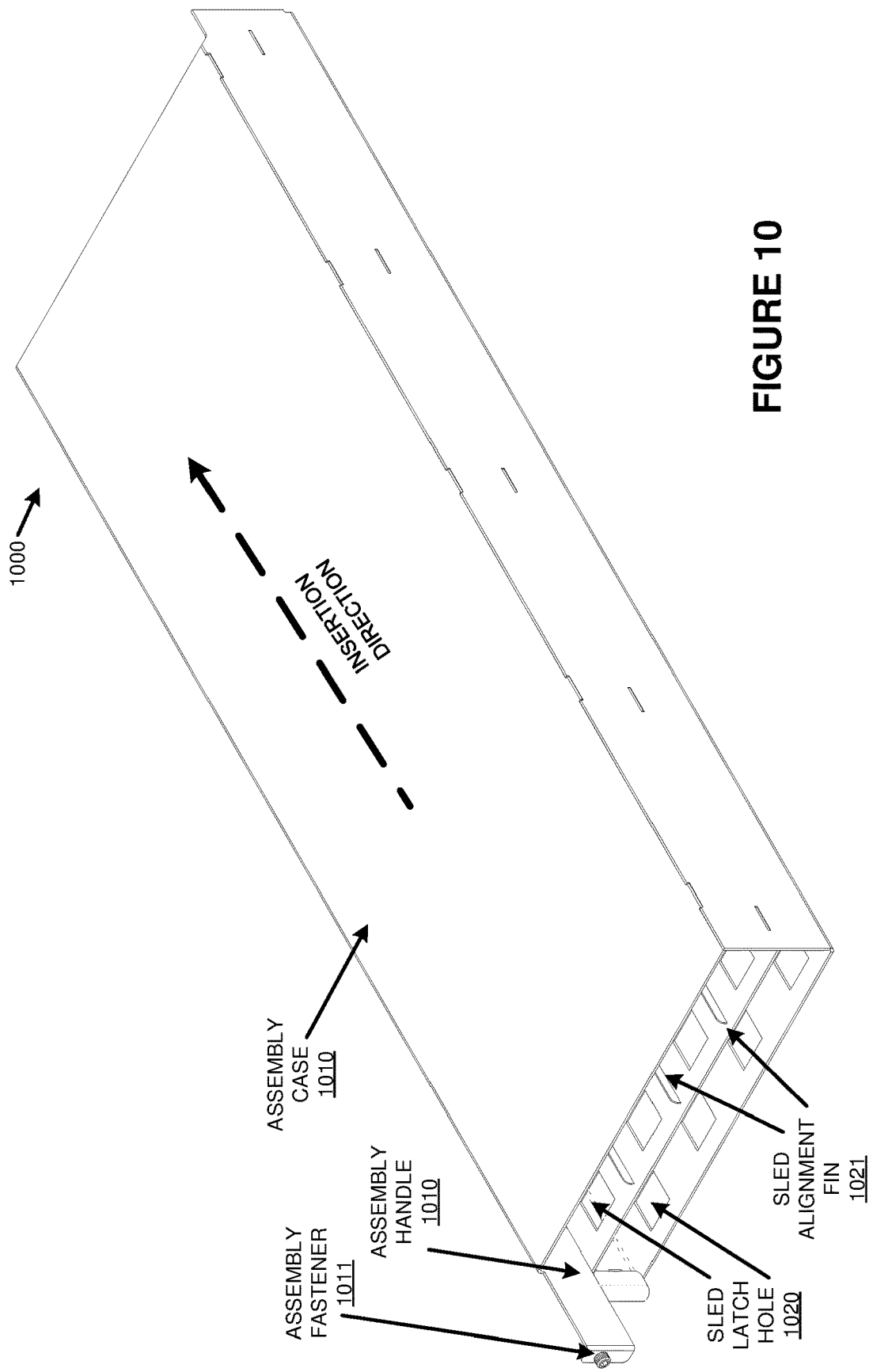
FIG. 10 is a picture of a storage sled carrier assembly.
Figure 11:
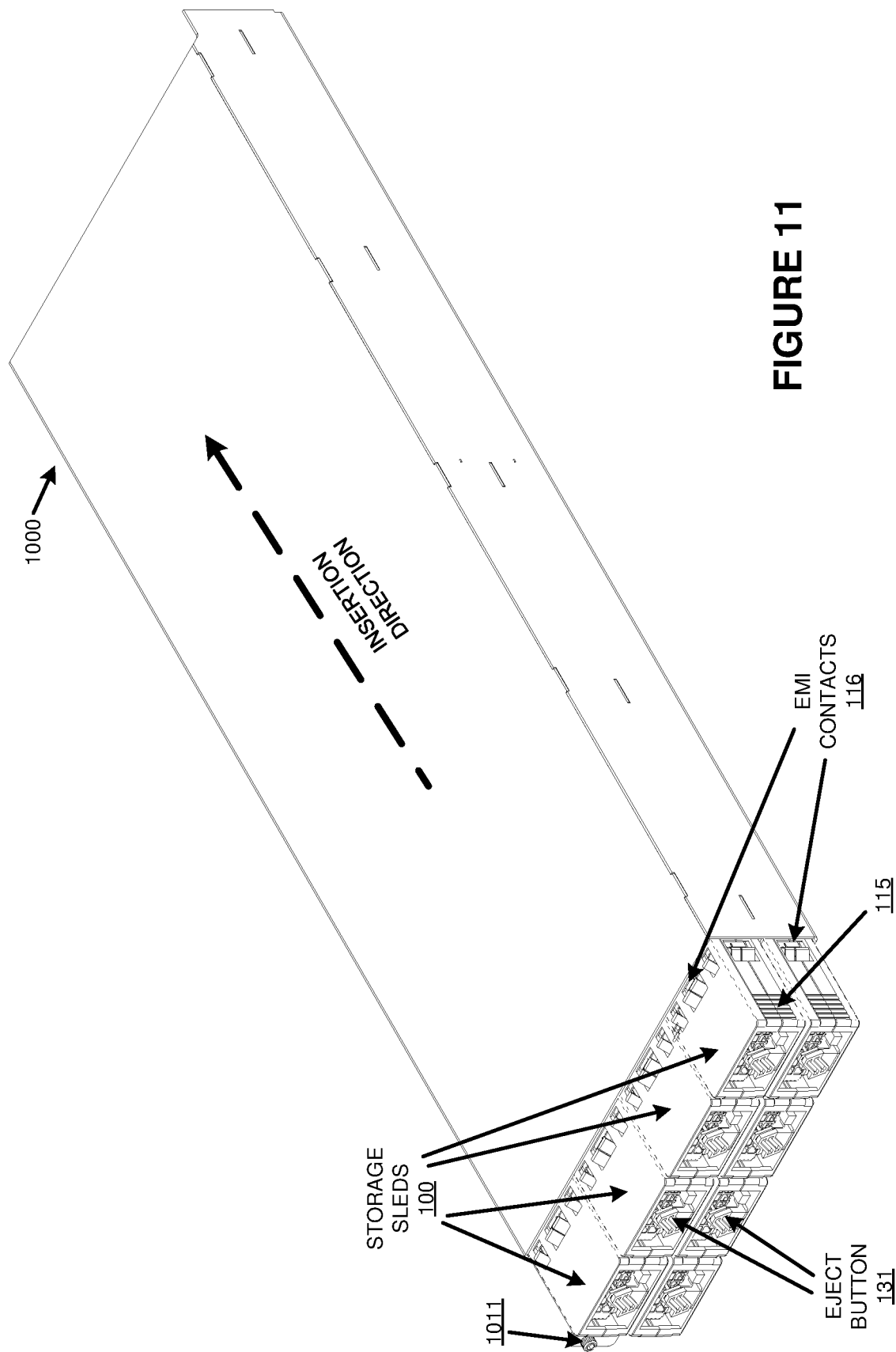
FIG. 11 is a picture of a storage sled carrier assembly.

FIG. 10 illustrates storage assembly 1000 into which storage sleds can be inserted and structurally contained. FIG. 10 shows an empty assembly, and FIG. 11 shows a filled assembly. Assembly 1000 can hold up to eight storage sleds, such as storage sled 100. Sled latch holes 1020 can engage sled latches for the insertion and ejection processes discussed above. Sled alignment fins 1021 provide channels for storage sleds to be inserted and inhibit side-to-side motion. Sled alignment fins 1021 also ensure proper alignment of storage sleds during insertion to provide for proper mating of storage sled electrical connectors to connectors associated with assembly 1000. Assembly 1000 can be inserted into a further assembly or enclosure, such as a rackmount assembly or rackmount enclosure. Assembly handle 1010 can provide for user or operator insertion and removal of assembly 1000 in the rackmount enclosure, such as in a 3U enclosure. Assembly fastener 1011 secures assembly 1000 into the rackmount enclosure, and can include screws, snap features, latches, or other fasteners.

FIG. 11 illustrates a fully assembled "octet" of storage sleds. EMI contacts 116 can be seen as protruding from each sled. In some examples, EMI contacts 116 electrically contact with conductive surfaces of assembly 1000, while in other examples, EMI contacts 116 allow for electrical contact with conductive surfaces of the rackmount enclosure into which assembly 1000 is inserted. Combinations of configurations of EMI contacts 116 can be employed.

Although not required in all examples, heatsinks can be deployed onto various components of the examples discussed herein. The heatsinks generally each include a heat dissipating member which can allow for heat transfer of elements to the surrounding environment. In some examples each heatsink is coupled to bulk metal portions of body 110 of sleds 100 or to case portions of assembly 1000. Multiple heat sinks can be employed for various chips and electrical components. Thermal interface elements can be employed, such as heat pads, glues, adhesives, thermal compounds, and the like, to better conduct heat from the associated components. In some examples, heatsinks are thermally coupled to assembly 1000 to further dissipate heat or spread heat along the body of assembly 1000.

Figure 13:
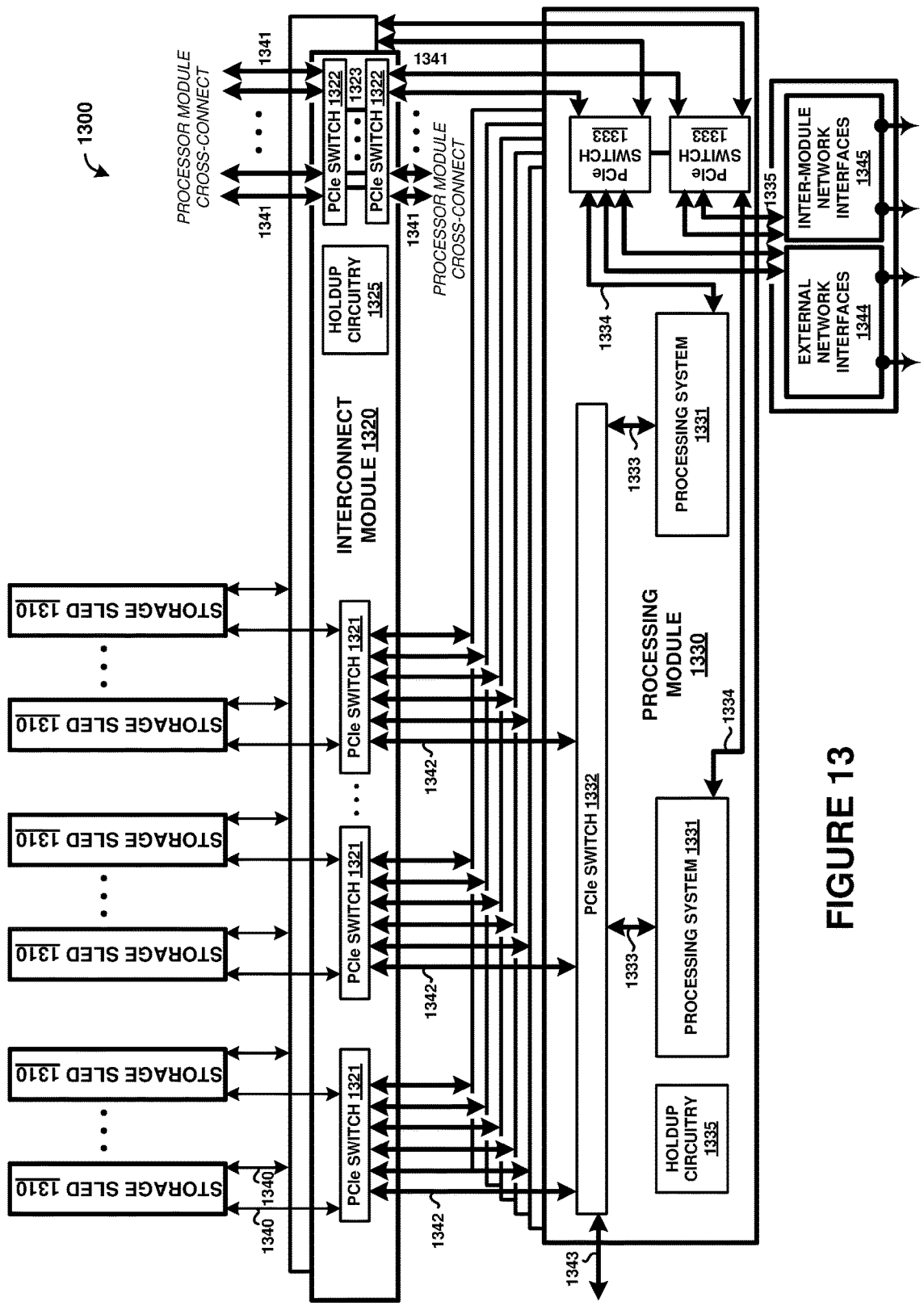
FIG. 13 is a system diagram of a storage system.

FIG. 12 illustrates a block diagram of storage module 1210, as an example of any of storage sleds 110 of FIG. 13. FIG. 12 also illustrates an example physical configuration of storage module 1210 as shown for circuit card assembly 1250. Storage module 1210 includes four storage drives 1211, PCIe switch 1212, processor 1220, power control module 1221, and holdup circuit 1222. Power control module 1221 distributes power to each element of storage module 1210 over associated power links 1230-1232. Power control module 1221 can selectively enable/disable power for each power link. Further communication links can be included for intra-sled communication between the various elements of storage module 1210.

PCIe switch 1212 communicates with an interconnect module (not pictured) over links 1240. Links 1240 are included in a data plane for transferring user data, such as that discussed for FIG. 13. Each of links 1240 comprises a PCIe link with four lanes, namely a "x4" PCIe link. More than one PCIe link 1240 is provided for load balancing, redundancy, and failover protection for storage module 1210. In some examples, PCIe switch 1212 has links 1240 connected to non-transparent (NT) interfaces or ports, where one or more host systems (such as a processor on a processing module) can interact with storage drives 1211 in a redundant or failover configuration. PCIe switch 1212 also communicates with four storage drives 111 over associated x4 PCIe links 1241.

Processor 1220 communicates over at least sideband links 1249. Sideband links 1249 can include Universal Serial Bus (USB), SMBus, JTAG, Inter-Integrated Circuit (I2C), controller area network bus (CAN), or any other communication interface, and in some examples is provided over portions of PCIe links 1240. In this example, processor 1220 includes I2C interface 1225 and USB interface 1226 for communication over sideband links 1249. I2C interface 1225 and USB interface 1226 can be included in separate circuitry or included in similar elements as processor 1220. Processor 1220 and PCIe switch 1212 can communicate over an associated communication link 1233, which can be an I2C or a PCIe link, among other link types.

Each storage drive 1211 comprises a solid state drive (SSD) in this example, and communicates with external systems over an associated PCIe interface included in each storage drive 1211. The solid state storage media of storage drives 1211 can comprise flash memory, static RAM, NAND flash memory, NOR flash memory, memristors, or other solid state media. Instead of or in addition to solid state media, each storage drive 1211 can comprise magnetic storage, such as hard disk drives, tape drives, magnetoresistive memory devices, and the like, or can comprise optical storage, such as phase change memory. Each storage drive 1211 can receive read transactions and write transactions issued by a host system, such as a processor of a processing sled node. Responsive to a read transaction, storage drive 1211 can retrieve data identified by the read transaction and transfer the data for delivery to the associated host. Responsive to a write transaction, storage drive 1211 can write data that accompanies the write transaction to storage media associated with storage drive 1211.

In some examples, each storage drive 1211 comprises a circuit card assembly (CCA) which is separate from CCA 1250 and with a mini-PCI Express connector or other connector that interfaces with a connector on CCA 1250. CCA 1250 comprises one or more printed circuit boards 1251 that couple to the various elements of storage module 1210. In other examples, each storage drive 1211 comprises one or more flash memory chips with a PCIe interface which is soldered onto CCA 1250. In yet other examples, each storage drive 1211 comprises one or more separate solid state disk drives or magnetic hard disk drives along with associated enclosures and circuitry. PCIe switch 1212 comprises a PCIe cross connect switch for establishing switched connections between any PCIe interfaces handled by PCIe switch 1212. In some examples, PCIe switch 1212 comprises a PLX Technology PEX8725 10-port, 24 lane PCIe switch chip.

Processor 1220 comprises one or more microprocessors, processing devices, multi-core processors, processing circuitry, or other processing system. Processor 1220 can include one or more non-transitory memory devices, such as RAM, solid state storage, or other memory to store instructions that are executable by processor 1220 to operate as discussed herein. In some examples, processor 1220 comprises an ARM microcontroller, ARM microprocessor, field-programmable gate array (FPGA), application specific integrated circuit (ASIC), application specific processor, or other microprocessor or processing elements. Processor 1220 can monitor usage statistics, traffic status, or other usage information through link 1233. PCIe switch 1212 can track this usage information during normal operation and data transfer with storage drives 1211, and processor 1220 can retrieve this usage information as needed over link 1233.

Power control module 1221 includes circuitry to selectively provide power to any of the elements of storage module 1210. Power control module 1221 can receive control instructions from processor 1220 or over any of PCIe links 1240. In some examples, power control module 1221 comprises processing elements discussed above for processor 1220, or is included in the elements of processor 1220. Power control module 1221 can receive power over power link 1223 as a power source for the various elements of storage module 1210. Holdup circuit 1222 includes energy storage devices for storing power received over power link 1223 for use during power interruption events, such as loss of source power. Holdup circuit 1222 can include capacitance storage devices, such as an array of capacitors. Further discussion of examples of power control circuitry is found below.

As seen in FIG. 12, arrows indicate a bidirectional power flow over link 1223. Power can be accepted by module 1210 when input power is available, such as from a mating connector or midplane. Power can be redistributed to other modules by module 1210 over link 1223 when input power is not available, such as during power interruption events. When module 1210 is removed from a mating connector, then power can be bled off into associated power sink circuitry. Although one power link 1223 is shown, it should be understood that more than one link can be included, such as separate input and output links or separate links for different voltage levels.

FIG. 13 is a system diagram illustrating storage system 1300. Storage system 1300 includes three different module types in FIG. 13, namely storage sleds 1310, interconnect modules 1320, and processing modules 1330. Although this example shows many storage sleds, 2 interconnect modules, and 6 processing modules. Any number of sleds or modules can be includes, such as 48 storage sleds or 64 storage sleds, along with a different number of interconnect or processing modules. Some examples can distribute functionality of each interconnect module 1320 among two or more modules. Additionally, power supply modules and associated power and control distribution links can also be included, but are omitted in FIG. 13 for clarity.

A module typically comprises physical support structure and enclosure that includes circuitry, printed circuit boards, semiconductor systems, and structural elements. The modules are insertable and removable from a rackmount style of enclosure. In some examples, the elements of FIG. 13 are included in a 3U chassis for mounting in a larger rackmount environment. It should be understood that the elements of FIG. 13 can be included in any physical mounting environment, and need not include any associated enclosures or rackmount elements.

Holdup circuitry is included on each sled 1310 to provide power to the associated sled when input power has been lost or removed for the sled. In some examples, the sled is removed from an associated mating connector and input power is lost due to the removal. In other examples, power is lost to system 1300, such as during a facility power outage or when an associated power supply fails. Similar holdup circuitry can be included on the other various modules of system 1300. Specifically, holdup circuitry 1325 is included on interconnect modules 1320 and holdup circuitry 1335 is included on processing modules 1330.

Turning to the example of storage sled 1310, the various holdup circuitry is also accompanied by a power controller circuit to selectively provide power to the elements of storage sled 1310. The power controller can receive control instructions from a processor of storage sled 1310 or from other processors or modules, such as over the Inter-Integrated Circuit (I2C), Ethernet, or Universal Serial Bus (USB) sideband interfaces discussed herein. Storage sled 1310 can receive power over one or more power links as a power source for the various elements of storage sled 1310. Holdup circuitry includes energy storage devices for storing power received over the power link for use during power interruption events, such as loss of source power. Holdup circuitry can include capacitance storage devices, such as an array of capacitors. Further discussion of examples of power control circuitry is found below.

As seen in FIG. 13, storage sleds 1310 can each provide self-power during power interruption events. Also, storage sleds 1310 can each redistribute power to other storage sleds. This redistributed power can be transferred to other storage sleds 1310 or to other modules in FIG. 13, such as interconnect module 1320 or processing module 1330. Typically, a storage sled will use any associated holdup power to commit in-flight write data associated with pending write operations before power down of the associated sled. The in-flight write data can be committed to storage drives of the associated storage sled, or can be committed to other non-volatile memory such as a non-volatile write cache which can hold write data until power is restored. In-flight write operations can also be held in non-volatile memory of interconnect module 1320 or processing module 1330 if the write operations have not yet reached an associated storage sled. Once any in-flight write data has been committed to non-volatile memory, then excess or remaining holdup power can be redistributed to other modules. In some examples, no pending write operations are present when input power is lost, and a larger amount of excess power is available on a particular storage sled. This excess power can be redistributed to a different storage sled to aid that sled in commit processes for associated write operations. Advantageously, excess holdup power of one sled or module can be used to power operations of another sled or module during power interruptions.

A plurality of storage sleds 1310 are included in system 1300. Each storage sled 1310 includes one or more storage drives, such as four each. Each storage sled 1310 also includes Peripheral Component Interconnect Express (PCIe) switches, processors, and control system elements. PCIe switches of each storage sled 1310 communicate with one or more on-sled storage drives over associated PCIe links. PCIe switches of each storage sled 1310 also are communicatively coupled to an on-sled processor or control system for traffic statistics retrieval and status monitoring, among other operations. PCIe switches of each storage sled 1310 communicate over one or more PCIe links 1340 with an associated PCIe switch 1321 of an interconnect module 1320.

Each PCIe switch 1321 of interconnect modules 1320 communicate over associated PCIe links 1342 with associated PCIe switch 1332 of one or more processing modules 1330. PCIe switch 1332 communicates with one or more associated processing systems 1331 as well as over one or more cross-connect PCIe links 1343. Interconnect modules 1320 also each include a plurality of PCIe switches 1322 for interconnecting processor modules, such as processor modules 1330. PCIe switches 1322 are included for processor module cross-connect, and communicate with ones of PCIe switches 1333 in associated processing modules 1330 over processor module cross-connect links 1341. PCIe switches 1333 communicate with ones of processing systems 1331 over PCIe links 1334.

In the example in FIG. 13, PCIe switches 1321 and 1332 (and associated PCIe links) are included in a data plane of system 1300, and used for carrying storage data between storage sleds 1310 and processing modules 1330. PCIe switches 1322 and 1333 (and associated PCIe links) are included in a control plane of system 1300, and used for carrying user control data and control signaling between processing modules.

Each processing module 1330 communicates over one or more PCIe links 1335 through PCIe switches 1333 with external expansion cards or external PCIe ports. In some examples, the external expansion cards include network interface cards for communicating over TCP/IP networks or carrying iSCSI traffic, among other network traffic types. These packet links are illustrated by packet network links 1344. External access to storage system 1300 is provided over ones of packet network links 1344, such as for end user access to data stored on storage sleds 1310.

Each processing module 1330 can also communicate with other processing modules, such as those in other storage assemblies or 3U enclosures, over one or more inter-module packet network interfaces 1345. In some examples, inter-module packet network interfaces 1345 include network interface cards for communicating over Ethernet or TCP/IP (Transmission Control Protocol (TCP)/Internet Protocol) networks for exchanging storage packets between processing modules. Further operation of inter-module storage packet exchange over Ethernet is discussed in the examples herein.

The PCIe switches discussed herein can comprise PCIe crosspoint switches, which logically interconnect various ones of the associated PCIe links based at least on the traffic carried by each PCIe link. Each PCIe switch port can comprise a non-transparent (NT) or transparent port. An NT port can allow some logical isolation between endpoints, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port. In other examples, a domain-based PCIe signaling distribution can be included which allows segregation of PCIe ports of a PCIe switch according to user-defined groups.

PCIe can support multiple bus widths, such as x1, x4, x8, x16, and x32, with each multiple of bus width comprising an additional "lane" for data transfer. PCIe also supports transfer of sideband signaling, such as System Management Bus (SMBus) interfaces and Joint Test Action Group (JTAG) interfaces, as well as associated clocks, power, and bootstrapping, among other signaling. Although PCIe is used in FIG. 13, it should be understood that different communication links or busses can instead be employed, such as Ethernet, Serial Attached SCSI (SAS), FibreChannel, Thunderbolt, Serial Attached ATA Express (SATA Express), among other interconnect, network, and link interfaces. Any of the links in FIG. 13 can each use various communication media, such as air, space, metal, optical fiber, or some other signal propagation path, including combinations thereof. Any of the links in FIG. 13 can include any number of PCIe links or lane configurations. Any of the links in FIG. 13 can each be a direct link or might include various equipment, intermediate components, systems, and networks. Any of the links in FIG. 13 can each be a common link, shared link, aggregated link, or may be comprised of discrete, separate links.

In FIG. 13, any processing system 1331 on any processing module 1330 has logical visibility to all storage drives in all storage sleds 1310. Any processing system 1331 can transfer data for storage on any storage drive and retrieve data already stored on any storage drive. Thus, 'm' number of storage drives can be coupled with 'n' number of processors to allow for a large, scalable architecture with a high-level of redundancy and density.

To provide visibility of each processing system 1331 to any storage sled 1310, various techniques can be employed. In a first example, a particular processing system 1331 manages (instantiates/binds) a subset number of the total quantity of storage sleds, such as 16 storage drives spanning 4 storage sleds, and handles transactions for that subset of storage drives, such as read and write transactions. Each processing system 1331, however, has memory-mapped visibility to the storage drives managed by any other processing system 1331. When a transaction is desired for a storage drive not managed by a particular processing system, the particular processing system uses the memory mapped access to all storage drives for that transaction. The transaction can be transferred and transitioned to the appropriate processing system that manages that storage drive associated with the data of the transaction. PCIe switches 1322 and 1333 are used to transfer data between processing systems so that a particular processing system or processor can store the data in the storage sled or sleds that is managed by that particular processing system, even though the data might be received over a network interface associated with a different processing system.

In operation, such as a write operation, data can be received over any network interface 1344 by any processing system 1331 of any processing module 1330. For example, the write operation can be a write operation received over network link 1344 from an end user employing an iSCSI protocol. The processing system that receives the write operation determines if it physically manages the storage drive or drives associated with the write operation, and if it does, then the processing system transfers the data for storage on the associated storage drives over data plane PCIe links 1333. If the processing system determines that it does not physically manage the storage drive or drives associated with the write operation, then the processing system transfers the write operation to another processing sled that includes the processing system that does manages the storage drive or drives over cross connect links 1334. Data striping can be employed by any processing system to stripe data for a particular write transaction over any number of storage drives, such as over all of the storage sleds that include storage drives managed by the particular processing system.

In this example, the PCIe interfaces associated with each processing system 1331 have 64-bit address spaces, which allows an addressable space of $2^{64}$ bytes, leading to at least 16 exbibytes of byte-addressable memory. The 64-bit PCIe address space can shared by all processing systems 1331 for memory mapping to storage drives on storage sleds. Thus, while each particular processing system 1331 actually manages a subset of the total storage drives on storage sleds, all processors 1331 have visibility to, and can initiate read/write transactions to, any of storage drives on storage sleds. A managing processing system 1331 that manages a particular storage drives on storage sleds receives write/read transactions and any associated data from an initiating processing system 1331 by at least using the memory mapped PCIe address space.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A data storage sled, comprising:
    a circuit card assembly comprising a plurality of connectors for coupling to drive modules and a host connector for coupling the data storage sled to an external connector;
    drive module mounting assembles configured to hold the individual ones of the drive modules into the associated connector by at least including adjustable mounting features to accommodate lengths of the individual ones of the drive modules.

2. The data storage sled of claim 1, wherein the drive modules each comprise M.2 solid state drive (SSD) modules, and wherein the mounting assemblies are configured to accommodate M.2 SSD modules of the varying lengths at least comprising 60 millimeters, 80 millimeters, and 110 millimeters.

3. The data storage sled of claim 1, comprising:
the drive module mounting assembles comprising a coarse adjustment features and fine adjustment features, the coarse adjustment features configured to select among standardized lengths of the drive modules and the fine adjustment features configured to hold an associated drive module in the associated connector and compensate for variability in the standardized lengths of the drive modules.

4. The data storage sled of claim 3, wherein the fine adjustment features are configured to hold the associated drive module in the associated connector using a spring-loaded end mount which engages an end of the associated drive module opposite of the connector and holds the associated drive module into the connector.

5. The data storage sled of claim 3, comprising:
an enclosure comprising apertures in the enclosure through which individual ones of the drive modules can be inserted into an associated connector on the circuit card assembly; and
wherein the coarse adjustment features comprise arms on the drive module mounting assembles which locate into side channels of the enclosure to select among the standardized lengths of the drive modules.

6. The data storage sled of claim 5, wherein the side channels of the enclosure comprise a plurality of widened slot features to accommodate the arms at predetermined locations corresponding to the standardized lengths of the drive modules.

7. The data storage sled of claim 1, further comprising:
an enclosure comprising apertures in the enclosure through which individual ones of the drive modules can be inserted into an associated connector on the circuit card assembly; and
an ejection spring within the enclosure configured to engage a pin of a storage assembly upon insertion of the data storage sled into the storage assembly, wherein the ejection spring is compressed due to the insertion of the data storage sled into the storage assembly;
a channel in the enclosure that allows the pin of the storage assembly clearance to engage the ejection spring and prevent insertion of the data storage sled in an incorrect orientation into the storage assembly.

8. The data storage sled of claim 7, further comprising:
an ejection button configured to eject the data storage sled from the storage assembly using compression of the ejection spring to disengage the data storage sled from the storage assembly, the ejection button coupled to a latch feature of the data storage sled that engages a slot in the storage assembly to hold the data storage sled in the storage assembly while the ejection spring remains compressed.

9. The data storage sled of claim 8, further comprising:
an indicator light coupled to the ejection button and configured to indicate at least an ejection status of the data storage sled.

10. The data storage sled of claim 1, wherein the drive modules each comprise a Peripheral Component Interconnect Express (PCIe) interface which couples to the associated connector of the circuit card assembly; and further comprising:
a PCIe switch coupled to the circuit card assembly and configured to communicatively couple associated PCIe interfaces of the drive modules over the host connector comprising at least one PCIe interface.

11. A data storage assembly comprising a plurality of removable data storage sleds, comprising:
partition features configured to divide the data storage assembly into a plurality of bays each configured to hold an associated data storage sled;
compression pins included in each of the plurality of bays to engage ejection springs of the data storage sleds;
each of the plurality of data storage sleds comprising:
a circuit card assembly comprising a plurality of connectors for coupling to drive modules and a host connector for coupling the data storage sled to an external connector;
drive module mounting assembles configured to hold the individual ones of the drive modules into the associated connector by at least including adjustable mounting features to accommodate lengths of the individual ones of the drive modules.

12. The data storage assembly of claim 11, wherein the drive modules each comprise M.2 solid state drive (SSD) modules, and wherein the mounting assemblies are configured to accommodate M.2 SSD modules of the varying lengths at least comprising 60 millimeters, 80 millimeters, and 110 millimeters.

13. The data storage assembly of claim 11, each of the plurality of data storage sleds comprising:
the drive module mounting assembles comprising a coarse adjustment features and fine adjustment features, the coarse adjustment features configured to select among standardized lengths of the drive modules and the fine adjustment features configured to hold an associated drive module in the associated connector and compensate for variability in the standardized lengths of the drive modules.

14. The data storage assembly of claim 13, wherein the fine adjustment features are configured to hold the associated drive module in the associated connector using a spring-loaded end mount which engages an end of the associated drive module opposite of the connector and holds the associated drive module into the connector.

15. The data storage assembly of claim 13, each of the plurality of data storage sleds further comprising:
an enclosure comprising a plurality of apertures in the enclosure through which individual ones of the drive modules can be inserted into an associated connector on the circuit card assembly;
wherein the coarse adjustment features comprise arms on the drive module mounting assembles which locate into side channels of the enclosure to select among the standardized lengths of the drive modules.

16. The data storage assembly of claim 15, wherein the side channels of the enclosure comprise a plurality of widened slot features to accommodate the arms at predetermined locations corresponding to the standardized lengths of the drive modules.

17. The data storage assembly of claim 11, each of the plurality of data storage sleds further comprising:
an enclosure comprising a plurality of apertures in the enclosure through which individual ones of the drive modules can be inserted into an associated connector on the circuit card assembly;

an ejection spring within the enclosure configured to engage an associated one of the compression pins of the storage assembly upon insertion of the data storage sled into the data storage assembly, wherein the ejection spring is compressed due to the insertion of the data storage sled into the data storage assembly;

a channel in the enclosure that allows the associated one of the compression pins of the data storage assembly clearance to engage the ejection spring and prevent insertion of the data storage sled in an incorrect orientation into the data storage assembly.

18. The data storage assembly of claim 17, each of the plurality of data storage sleds further comprising:

an ejection button configured to eject the data storage sled from the data storage assembly using compression of the ejection spring to disengage the data storage sled from the data storage assembly, the ejection button coupled to a latch feature of the data storage sled that engages an associated slot in the data storage assembly to hold the data storage sled in the data storage assembly while the ejection spring remains compressed.

19. The data storage assembly of claim 18, each of the plurality of data storage sleds further comprising:

an indicator light coupled to the ejection button and configured to indicate at least an ejection status of the data storage sled.

20. The data storage assembly of claim 11, wherein the drive modules each comprise a Peripheral Component Interconnect Express (PCIe) interface which couples to the associated connector of the circuit card assembly; and each of the plurality of data storage sleds further comprising:

a PCIe switch coupled to the circuit card assembly and configured to communicatively couple associated PCIe interfaces of the drive modules over the host connector comprising at least one PCIe interface.

* * * * *